(12) United States Patent
Son et al.

(10) Patent No.: US 11,087,821 B2
(45) Date of Patent: Aug. 10, 2021

(54) MEMORY MODULE INCLUDING REGISTER CLOCK DRIVER DETECTING ADDRESS FREQUENTLY ACCESSED

(71) Applicant: SAMSUNG ELECTRONICS CO., LTD., Suwon-si (KR)

(72) Inventors: Jongpil Son, Seongnam-si (KR); Wooyeong Cho, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/367,385

(22) Filed: Mar. 28, 2019

(65) Prior Publication Data

US 2020/0090729 A1 Mar. 19, 2020

(30) Foreign Application Priority Data

Sep. 17, 2018 (KR) .................. 10-2018-0111012

(51) Int. Cl.
*G11C 11/406* (2006.01)
*G11C 11/4076* (2006.01)
*G11C 11/408* (2006.01)
*G06F 3/06* (2006.01)

(52) U.S. Cl.
CPC ........ *G11C 11/4076* (2013.01); *G06F 3/0604* (2013.01); *G06F 3/0659* (2013.01); *G06F 3/0661* (2013.01); *G06F 3/0673* (2013.01); *G11C 11/4082* (2013.01); *G11C 11/4085* (2013.01); *G11C 11/4087* (2013.01); *G11C 11/40611* (2013.01)

(58) Field of Classification Search
CPC ........... G11C 11/4076; G11C 11/40611; G11C 11/4085; G11C 11/4082; G11C 11/4087; G11C 7/109; G11C 5/04; G11C 8/18; G11C 11/406; G06F 3/0661; G06F 3/0604; G06F 3/0659; G06F 3/0673
See application file for complete search history.

(56) References Cited

U.S. PATENT DOCUMENTS

| | | | |
|---|---|---|---|
| 7,565,480 B2 | 7/2009 | Ware et al. | |
| 8,924,680 B2 | 12/2014 | Perego et al. | |
| 9,236,110 B2 | 1/2016 | Bains et al. | |
| 9,299,400 B2 | 3/2016 | Bains et al. | |
| 9,449,671 B2 | 9/2016 | Crawford et al. | |
| 9,478,316 B1* | 10/2016 | Ryu | G11C 29/785 |
| 9,589,606 B2 | 3/2017 | Lin et al. | |
| 9,761,298 B2 | 9/2017 | Halbert et al. | |

(Continued)

FOREIGN PATENT DOCUMENTS

| | | |
|---|---|---|
| KR | 10-2015-0085485 A | 7/2015 |
| KR | 10-2017-0127046 A | 11/2017 |

*Primary Examiner* — Khamdan N Alrobaie
(74) *Attorney, Agent, or Firm* — Sughrue Mion, PLLC

(57) ABSTRACT

A memory module includes a plurality of memory devices each including a memory cell array, and a register clock driver connected to the memory devices. The register clock driver detects a row hammer address among row addresses corresponding to word lines of the memory cell array, converts a refresh command, among a plurality of refresh commands received from a memory controller for refreshing the memory cell array, to a row hammer refresh command, and transmits the row hammer refresh command and the row hammer address to each of the memory devices.

20 Claims, 10 Drawing Sheets

(56) References Cited

U.S. PATENT DOCUMENTS

| | | | |
|---|---|---|---|
| 9,812,185 B2 | 11/2017 | Fisch et al. | |
| 9,818,469 B1* | 11/2017 | Kim | G06F 3/0619 |
| 10,223,311 B2* | 3/2019 | Doo | G06F 13/3625 |
| 10,607,683 B2* | 3/2020 | Shin | G11C 11/4091 |
| 2007/0133332 A1* | 6/2007 | Chun | G11C 11/406 |
| | | | 365/222 |
| 2008/0082290 A1* | 4/2008 | Jeong | G11C 11/40626 |
| | | | 702/130 |
| 2015/0049567 A1* | 2/2015 | Chi | G11C 29/783 |
| | | | 365/222 |
| 2015/0206575 A1* | 7/2015 | Morgan | G11C 11/40611 |
| | | | 365/222 |
| 2017/0220293 A1* | 8/2017 | Kim | G11C 14/0009 |
| 2017/0277463 A1* | 9/2017 | Yoon | G06F 11/07 |

\* cited by examiner

MEMORY MODULE INCLUDING REGISTER CLOCK DRIVER DETECTING ADDRESS FREQUENTLY ACCESSED

CROSS-REFERENCE TO THE RELATED APPLICATION

This application claims priority from Korean Patent Application No. 10-2018-0111012 filed on Sep. 17, 2018, in the Korean Intellectual Property Office, the disclosure of which is incorporated by reference herein in its entirety.

BACKGROUND

Apparatuses and methods consistent with exemplary embodiments of the inventive concept relate to a memory module including a register clock driver to detect a frequently accessed address.

Among memory devices, a dynamic random access memory (DRAM) device may store data by storing charges to a capacitor of a memory cell. Since the charges in the capacitor are leaked over time, the DRAM device may refresh the memory cell. A memory controller may access an address of the DRAM device randomly, and in particular, may access a particular address frequently or intensively.

As the particular address is frequently accessed, disturbance may occur at data stored in the memory cell. To prevent such disturbance, the memory device may include a circuit which detects and manages an address which the memory controller frequently accesses. However, as the capacity and degree of integration of the memory device increase, a space between memory cells may decrease, thereby causing an increase of an area of the above-described circuit detecting and managing the frequently accessed address.

SUMMARY

Various exemplary embodiments of the inventive concept provide a memory module including a register clock driver to detect a frequently accessed address.

According to an exemplary embodiment, there is provided a memory module which may include a plurality of memory devices each including a memory cell array, and a register clock driver connected to the memory devices. The register clock driver detects a row hammer address among row addresses corresponding to word lines of the memory cell array, converts a refresh command, among a plurality of refresh commands received from a memory controller for refreshing the memory cell array, to a row hammer refresh command, and transmits the row hammer refresh command and the row hammer address to each of the memory devices.

According to an exemplary embodiment, there is provided a memory module which may include a plurality of memory devices, and a register clock driver configured to receive a plurality of refresh commands for refreshing a memory cell array of each of the memory devices from a memory controller, convert a refresh command among the refresh commands to a row hammer refresh command, and transmit the row hammer refresh command and the other refresh commands to each of the memory devices. The register clock driver is further configured to receive a row hammer address corresponding to a word line of the memory cell array from the memory controller at least once, latch the row hammer address, and transmit the row hammer address to each of the memory devices together with the row hammer refresh command.

According to an exemplary embodiment, there is provided a memory module which may include a plurality of memory devices each including a memory cell array, and a register clock driver configured to receive a plurality of refresh commands for refreshing a memory cell array of each of the memory devices from a memory controller, convert a refresh command among the refresh commands to a row hammer refresh command, and transmit the row hammer refresh command and the other refresh commands to each of the memory devices. The register clock driver configured to receive a plurality of refresh commands for refreshing a memory cell array of each of the memory devices from a memory controller, convert a refresh command among the refresh commands to a row hammer refresh command, and transmit the row hammer refresh command and the other refresh commands to each of the memory devices.

DETAILED DESCRIPTION

Below, various embodiments of the inventive concept will be described in detail and clearly to such an extent that an ordinary one in the art easily implements the inventive concept. These embodiments are all exemplary, not intended to limit the scope of the inventive concept.

Figure 1:
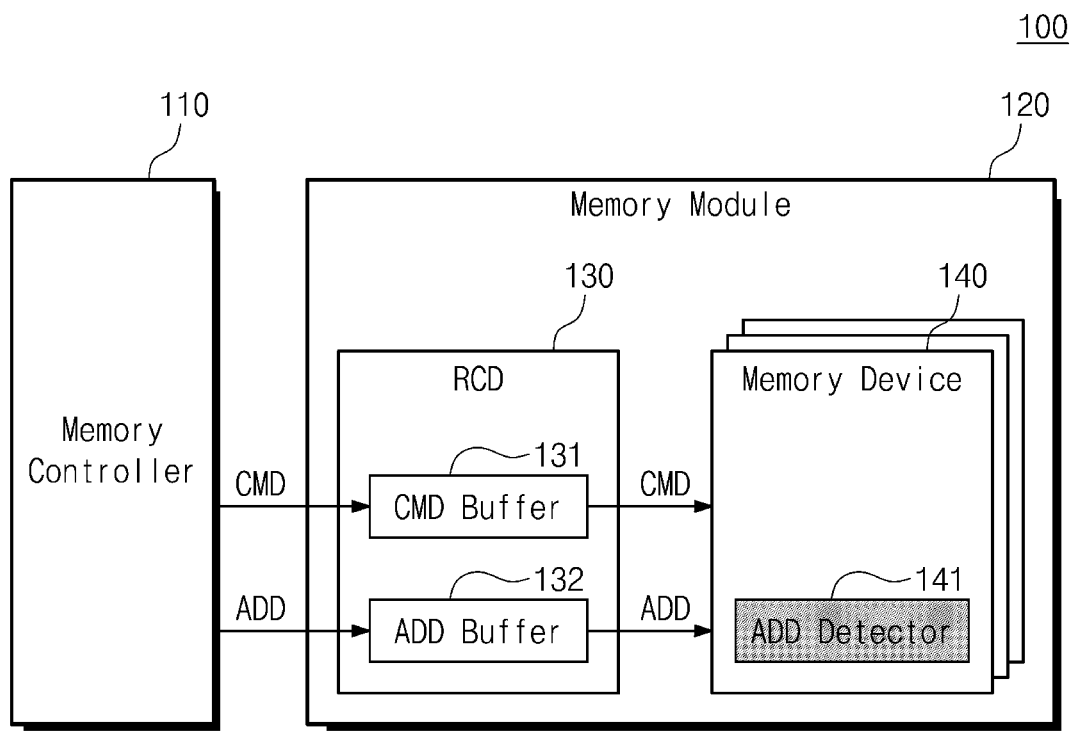
FIG. 1 illustrates is a block diagram of an electronic device according to an embodiment.

FIG. 1 illustrates is a block diagram of an electronic device according to an embodiment. An electronic device 100 may include a memory controller 110 and a memory module 120. For example, the electronic device 100 may be one of various electronic devices such as a desktop computer, a laptop computer, a workstation, a server, a mobile device, etc.

The memory controller 110 may control the memory module 120. The memory controller 110 may perform data input/output on the memory module 120. The memory controller 110 may be implemented in a host (not illustrated), and may access the memory module 120 according to a request of a processor (not illustrated) in the host. For example, the memory controller 110 may access the memory module 120 in a direct memory access (DMA) manner. The memory controller 110 may transmit or issue a command CMD and an address ADD which are defined in the specification of the memory module 120, to the memory module 120.

The memory module 120 may operate as a buffer memory, a working memory, or a main memory of the host which includes the memory controller 110. The memory module 120 may operate based on the command CMD and the address ADD transmitted by the memory controller 110. The memory module 120 may store data transmitted from the memory controller 110 or may transmit data to the memory controller 110. The memory module 120 may include a register clock driver 130 and a memory device 140. The number of register clock drivers and the number of memory devices are not limited to an example of FIG. 1, and the memory module 120 may include one or more register clock drivers and one or more memory devices.

The register clock driver 130 may be connected to one or more memory devices 140 to drive the one or more memory devices 140. The register clock driver 130 may buffer the command CMD and the address ADD received from the memory controller 110, and may transmit the buffered command CMD and the buffered address ADD to the memory devices 140. The register clock driver 130 may include a command buffer 131 transmitting the command CMD to the memory devices 140 and an address buffer 132 transmitting the address ADD to the memory devices 140.

The register clock driver 130 may be a buffer chip for transmitting the command CMD and the address ADD of the memory controller 110 to the memory devices 140. The memory devices 140 may receive the command CMD and the address ADD from the memory controller 110 through the register clock driver 130, and may not receive the command CMD and the address ADD directly from the memory controller 110. The register clock driver 130 may improve signal integrity (SI) of the command CMD and the address ADD transmitted from the memory controller 110 to the memory devices 140.

The memory device 140 may perform data input/output requested by the memory controller 110, based on the command CMD and the address ADD transmitted from the register clock driver 130. The memory device 140 may be referred to as a "memory chip". As described above, the number of memory devices which may be mounted in the memory module 120 may be one or more. For example, each of a first memory device (corresponding to 140) and a second memory device (corresponding to 140) which are identical to each other may receive the command CMD and the address ADD from the register clock driver 130. That is, the command CMD and the address ADD which the first memory device receives may be identical to the command CMD and the address ADD which the second memory device receives.

However, a first data input/output path of the first memory device may be different from a second data input/output path of the second memory device. The first memory device may perform data input/output with the memory controller 110 through the first data input/output path (refer to FIG. 10), based on the command CMD and the address ADD. The second memory device may perform data input/output with the memory controller 110 through the second data input/output path (refer to FIG. 10), based on the command CMD and the address ADD.

In an embodiment, the memory device 140 may be a dynamic random access memory (DRAM) device, a static random access memory (SRAM) device, a thyristor random access memory (TRAM) device, a NAND flash memory device, a NOR flash memory device, a resistive random access memory (RRAM) device, a ferroelectric random access memory (FRAM) device, a phase change random access memory (PRAM) device, a magnetic random access memory (MRAM) device, etc. A kind of the memory devices 140 mounted in the memory module 120 may be one or more. The memory module 120 may include one of a dual-inline memory module (DIMM), a registered DIMM (RDIMM), a load reduced DIMM (LRDIMM), and a non-volatile DIMM (NVDIMM), which include the memory devices 140 and the register clock driver 130. Below, it is assumed that the memory device 140 is a DRAM device supporting a double data rate (DDR) interface.

The memory device 140 may include an address detector 141. The address detector 141 may receive a row hammer address RH_ADD. The row hammer address RH_ADD may indicate an address, which is frequently accessed or called by the memory controller 110, from among all addresses of the memory device 140. The number of times that the row hammer address RH_ADD is accessed by the memory controller 110 may be relatively greater than the number of times that any other address of the memory device 140 is accessed by the memory controller 110. Since the memory device 140 is a random access memory (RAM), the memory controller 110 may intensively use only a particular address (i.e., the row hammer address RH_ADD) of the memory device 140.

However, the above operation of the memory controller 110 may cause disturbance, pass gate effect (PGE), coupling, etc. with regard to data stored at a location adjacent to a location corresponding to the row hammer address RH_ADD. For example, in a case where frequent, intensive, or iterative activation and deactivation is performed on a word line corresponding to the row hammer address RH_ADD by the memory controller 110 (i.e., in a case of row hammering), data of memory cells connected to a word line adjacent to the word line corresponding to the row hammer address RH_ADD may be damaged.

The row hammering may cause a decrease of a refresh characteristic of a memory cell. The memory cells which are connected to the word line adjacent to the word line corresponding to the row hammer address RH_ADD should be refreshed more frequently than any other memory cells. Accordingly, the memory device 140 may detect the row hammer address RH_ADD by using the address detector 141, and may manage data stored in memory cells which are connected to the word line adjacent to the word line corresponding to the row hammer address RH_ADD. The memory device 140 may perform a refresh operation on the memory cells which are connected to the word line adjacent to the word line corresponding to the row hammer address RH_ADD. The memory device 140 may prevent data from being damaged due to the row hammering.

Referring to FIG. 1, each of the memory devices 140 may include the address detector 141. However, as a sub-micron technology for the memory devices 140 develops, a space between memory cells, a space between word lines, and a space between bit lines may decrease, and thus, a refresh characteristic of a memory cell may be gradually degraded due to the row hammering. A ratio of the area of the address detector 141 to the whole area of each of the memory devices 140 may also increase. Accordingly, according to an embodiment, the address detector 141 may not be positioned in each of the memory devices 140 as illustrated in FIG. 1, but the address detector 141 may be positioned in the register clock driver 130 as illustrated in FIG. 2.

Figure 2:
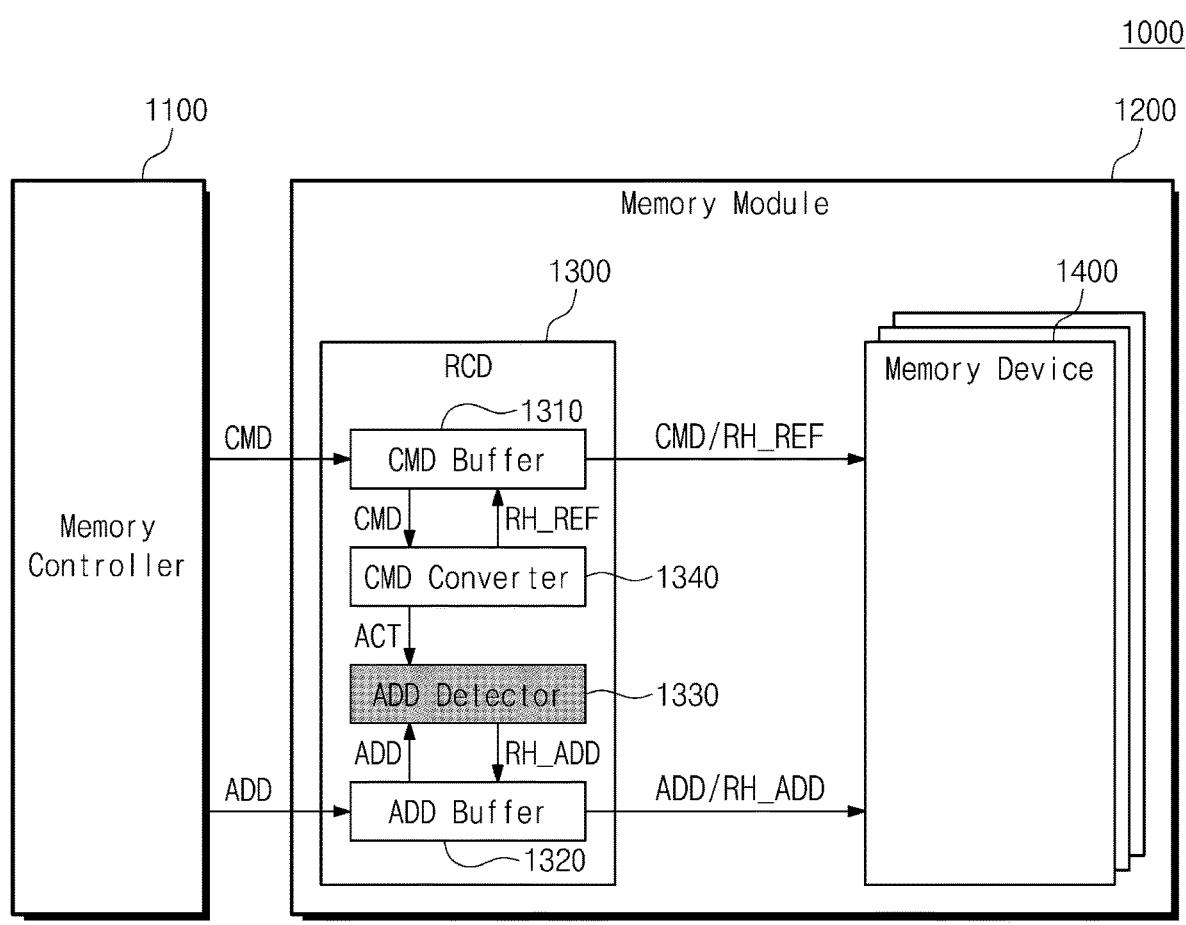
FIG. 2 illustrates is a block diagram of an electronic device according to an embodiment.

FIG. 2 illustrates is a block diagram of an electronic device according to an embodiment. An electronic device 1000 may include a memory controller 1100 and a memory module 1200. The memory module 1200 may include a register clock driver 1300 and a memory device 1400. The register clock driver 1300 may include a command buffer 1310, an address buffer 1320, an address detector 1330, and a command converter 1340. The register clock driver 1300 and the memory device 1400 may be implemented as separate chips in the memory module 1200, according to an embodiment Here, operations of the components 1100, 1200, 1300, 1310, 1320, and 1400 of the electronic device 1000 may be similar to the operations of the components 110, 120, 130, 131 132, and 140 of the electronic device 100 of FIG. 1.

The register clock driver 1300 may further include the address detector 1330 and the command converter 1340 compared with the register clock driver 130 of FIG. 1. An operation of the address detector 1330 may be similar to the operation of the address detector 141 included in each of the memory devices 140 described with reference to FIG. 1. That is, since the register clock driver 1300 includes the address detector 1330, each of the memory devices 1400 may not include an address detector. The address detector 1330 may repeatedly receive an address ADD from the memory controller 1100 through the address buffer 1320. The address detector 1330 may repeatedly receive the address ADD directly from the memory controller 1100. The address detector 1330 may repeatedly receive an activate command ACT from the command converter 1340 to be described later.

Here, the activate command ACT may be generated by the memory controller 1100, and a word line of the memory devices 1400 may be activated by the activate command ACT. The memory controller 1100 may transmit the address ADD corresponding to a word line targeted for activation to the register clock driver 1300 together with the activate command ACT. The address ADD transmitted together with the activate command ACT may be a row address.

The address detector 1330 may detect a row hammer address RH_ADD based on the activate command ACT and the address ADD which are repeatedly received. The address detector 1330 may transmit the row hammer address RH_ADD to the address buffer 1320. Like the transmission of the address ADD from the memory controller 1100 to the memory devices 1400, the address buffer 1320 may transmit the row hammer address RH_ADD to the memory devices 1400. The address detector 1330 may transmit the row hammer address RH_ADD directly to the memory devices 1400.

The command converter 1340 may repeatedly receive a command CMD from the memory controller 1100 through the command buffer 1310. The command converter 1340 may receive the command CMD directly from the memory controller 1100. The command converter 1340 may decode the command CMD. When the command CMD generated by the memory controller 1100 is an activate command ACT, the command converter 1340 may transmit the activate command ACT to the address detector 1330. The command converter 1340 may further include a command decoder (not illustrated) for decoding the command CMD. The command decoder may be implemented in the register clock driver 1300 separately from the command converter 1340.

The command converter 1340 may decode the command CMD. When the command CMD generated by the memory controller 1100 is a refresh command REF, the command converter 1340 may convert the refresh command REF to a row hammer refresh command RH_REF. In detail, the command converter 1340 may repeatedly receive the refresh command REF from the memory controller 1100, and may convert only some of the received refresh commands REF to the row hammer refresh command(s) RH_REF depending on a preset reference ratio. That is, the command converter 1340 may not convert all refresh commands REF generated by the memory controller 1100 to the row hammer refresh commands RH_REF. The preset reference ratio may indicate a ratio of the row hammer refresh commands RH_REF to the refresh commands REF received from the memory controller 1100, and may be a fixed value or a variable value.

The command converter 1340 may transmit a row hammer refresh command RH_REF to the command buffer 1310. Like the transmission of the command CMD from the memory controller 1100 to the memory devices 1400, the command buffer 1310 may transmit the row hammer refresh command RH_REF to the memory devices 1400. The command converter 1340 may transmit the row hammer refresh command RH_REF directly to the memory devices 1400. The register clock driver 1300 may transmit the row hammer refresh command RH_REF and the row hammer address RH_ADD together.

When the refresh command REF for refreshing memory cells is received, the memory device 1400 may refresh memory cells connected to a word line corresponding to an address automatically generated in the memory device 1400 by activating and deactivating the word line (i.e., an auto refresh operation). Since an address is automatically generated in the memory device 1400 depending on the refresh command REF, the memory controller 1100 may generate only the refresh command REF, and may not generate an address of memory cells to be refreshed.

When the row hammer address RH_ADD is received together with the row hammer refresh command RH_REF, the memory device 1400 may refresh memory cells connected to a word line adjacent to a word line corresponding to the row hammer address RH_ADD by activating and deactivating the word line adjacent to the word line corresponding to the row hammer address RH_ADD. When the memory device 1400 receives any one of the refresh command REF and the row hammer refresh command RH_REF, the memory device 1400 may perform a refresh operation on memory cells. A location of a memory cell to be refreshed depending on the refresh command REF may be identical to or different from a location of a memory cell to be refreshed depending on the row hammer refresh command RH_REF.

The refresh command REF may be generated by the memory controller 1100 so that each of the memory devices 1400 performs a refresh operation on memory cells, and may be defined in the protocol between the memory controller 1100 and the memory devices 1400. The row hammer refresh command RH_REF may be generated by not the memory controller 1100 but the register clock driver 1300 so that each of the memory devices 1400 performs a refresh operation on memory cells, and may be defined in the protocol between the register clock driver 1300 and the memory devices 1400. For example, the following Table 1 shows the refresh command REF and the row hammer refresh command RH_REF.

TABLE 1

| Command | ACT_n | RAS_n | CAS_n | WE_n | A[0:X] |
|---|---|---|---|---|---|
| REF | H | L | L | H | — |
| RH_REF | (Logic states are pre-defined) | | | | RH_ADD |

The memory controller 1100 may generate the command CMD by setting logical states of command signals ACT_n, RAS_n, CAS_n, and WE_n. The command signals ACT_n, RAS_n, CAS_n, and WE_n may configure the command CMD. However, the command signals ACT_n, RAS_n, CAS_n, and WE_n of Table 1 are exemplary, and any other command signals or any other address signals may be used to configure the refresh command REF and the row hammer refresh command RH_REF.

The memory controller 1100 may generate the refresh command REF by setting logical states of the command signals ACT_n, RAS_n, CAS_n, and WE_n in compliance with the protocol between the memory controller 1100 and the memory devices 1400. Referring to Table 1, for example, the memory controller 1100 may generate the refresh command REF by setting the command signals ACT_n and WE_n to a logical high and the command signals RAS_n and CAS_n to a logical low. The memory controller 1100 may not set logical states of address signals A[0:X] when generating the refresh command REF. Here, "X" is any natural number.

Like the memory controller 1100, the register clock driver 1300 may generate the row hammer refresh command RH_REF by setting logical states of the command signals ACT_n, RAS_n, CAS_n, and WE_n in compliance with the protocol between the register clock driver 1300 and the memory devices 1400. Also, unlike the memory controller 1100, the register clock driver 1300 may set logical states of the address signals A[0:X] depending on the row hammer address RH_ADD.

Figure 3:
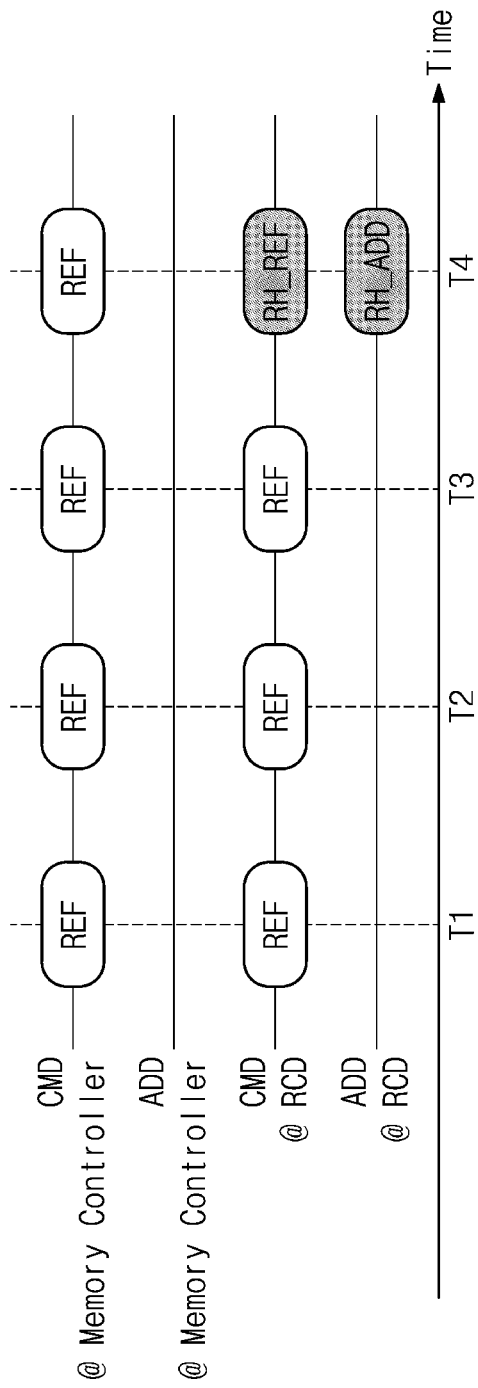
FIG. 3 illustrates an exemplary timing diagram of operations of a memory controller and a register clock driver of FIG. 2.

FIG. 3 illustrates an exemplary timing diagram of operations of a memory controller and a register clock driver of FIG. 2. FIG. 3 will be described with reference to FIG. 2.

At respective time points T1, T2, and T3, the memory controller 1100 may generate refresh commands REF. The register clock driver 1300 may transmit the refresh command REF to the memory devices 1400 without modification. Each of the memory devices 1400 may perform a refresh operation on memory cells based on the refresh command REF. As described above, the memory controller 1100 may not generate an address of memory cells to be refreshed, together with the refresh command REF. For example, each of the memory devices 1400 may automatically determine locations of memory cells to be refreshed depending on the refresh command REF.

At a time point T4, the memory controller 1100 may generate a refresh command REF. Unlike the time points T1, T2, and T3, the register clock driver 1300 may not transmit the refresh command REF directly to the memory devices 1400. Instead, the register clock driver 1300 may convert the refresh command REF to a row hammer refresh command RH_REF, and may transmit the row hammer address RH_ADD to the memory devices 1400 together with the row hammer refresh command RH_REF. After the time point T4, the memory controller 1100 and the register clock driver 1300 may repeatedly perform operations of the time points T1 to T4.

As described above, the register clock driver 1300 may convert some of the refresh commands REF generated by the memory controller 1100 to the row hammer refresh command RH_REF, depending on a preset reference ratio. An example is illustrated in FIG. 3 as, when the fourth refresh command REF is received, the register clock driver 1300 converts the fourth refresh command REF to the row hammer refresh command RH_REF (in this case, a reference ratio is ¼). However, the above-described values are only exemplary. Also, in FIG. 3, the number of refresh commands REF, an interval between the refresh commands REF, the number of row hammer refresh commands RH_REF, and the number of row hammer addresses RH_ADD are only exemplary.

In an embodiment, the command converter 1340 of the register clock driver 1300 may count the number of times that the refresh command REF is received from the memory controller 1100, based on the reference ratio. The command converter 1340 may convert the refresh command REF to the row hammer refresh command RH_REF based on a result of the counting. When the number of times that the refresh command REF is received from the memory controller 1100 reaches a reference value (e.g., 4) determined according to the reference ratio (e.g., ¼), the command converter 1340 may convert the refresh command REF to the row hammer refresh command RH_REF. For example, the reference ratio and the reference value may be determined in advance, or may vary with a refresh characteristic of the memory devices 1400.

In an embodiment, although not illustrated in FIG. 3, the memory controller 1100 may further generate any other command CMD as well as the refresh command REF. Any other command CMD may be generated between the refresh commands REF. For example, the memory controller 1100 may generate the refresh command REF, may generate at least one different command CMD, and may issue the refresh command REF again.

For example, the at least one different command CMD may include an activate command ACT. The memory controller 1100 may generate an address ADD corresponding to a word line to be activated, together with the activate command ACT. The memory controller 1100 may generate a plurality of activate commands ACT during any interval between the refresh commands REF or until the number of times that the register clock driver 1300 receives the refresh command REF reaches the reference value. In a case where the memory controller 1100 frequently or intensively accesses or select a particular address together with the plurality of activate commands ACT, the address detector 1330 may detect the particular address as a row hammer address RH_ADD. The address detector 1330 may detect, as the row hammer address RH_ADD, one of addresses ADD which are received during any interval between the refresh commands REF (e.g., an interval from T1 to T3, an interval from T1 to T4, an interval being not smaller than an interval from T1 to T4, a refresh interval tREFI, etc.) or until the number of times that the refresh command REF is received from the memory controller 1100 reaches the reference value.

Figure 4:
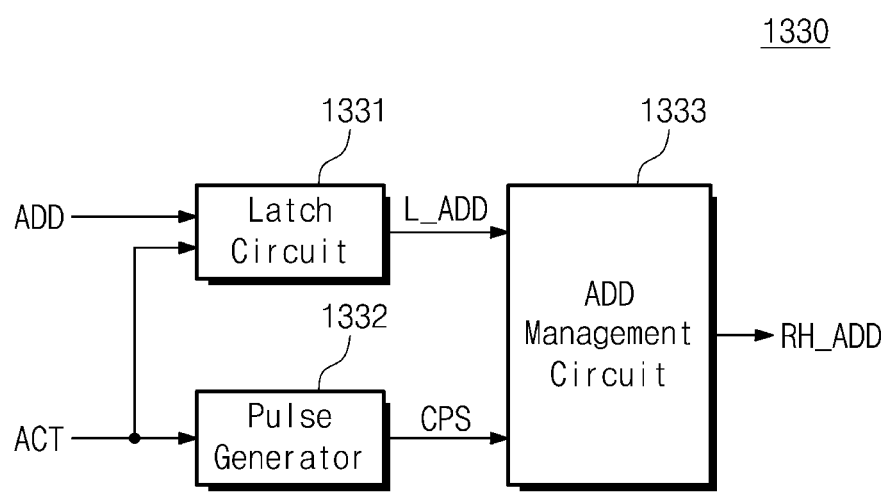
FIG. 4 illustrates an exemplary block diagram of an address detector of FIG. 2.

FIG. 4 illustrates an exemplary block diagram of an address detector of FIG. 2. The address detector 1330 may include a latch circuit 1331, a pulse generator 1332, and an address management circuit 1333.

When the activate command ACT is generated from the memory controller 1100, the latch circuit 1331 may latch, as a row address, the address ADD generated together with the activate command ACT. The latch circuit 1331 may receive a signal indicating that the activate command ACT is generated, from the command decoder (not illustrated) of the register clock driver 1300. The latch circuit 1331 may include a plurality of registers storing bits of the address ADD, respectively.

When the activate command ACT is generated from the memory controller 1100, the pulse generator 1332 may generate a count pulse signal CPS having any period. The pulse generator 1332 may not generate the count pulse signal CPS when a precharge command PRE is generated.

The pulse generator 1332 may include various logic gates, a circuit, etc. for generating the count pulse signal CPS.

The address management circuit 1333 may store access values each indicating the number of times that the address ADD corresponding to a word line of each of the memory devices 1400 is accessed. The address management circuit 1333 may manage and store a mapping table indicating a relationship between word lines and the access values. The address management circuit 1333 may sequentially count or increase an access value corresponding to an address L_ADD latched by the latch circuit 1331, based on the count pulse signal CPS. The address management circuit 1333 may detect or generate the row hammer address RH_ADD, based on the access values.

For example, the access value of the row hammer address RH_ADD may be greater than remaining access values stored in the address management circuit 1333 (i.e., a maximum value). For another example, when an access value corresponding to the address ADD latched by the latch circuit 1331 reaches or exceeds a threshold value, the address management circuit 1333 may detect the address ADD having the access value reaching or exceeding the threshold value, as the row hammer address RH_ADD.

Figure 5:
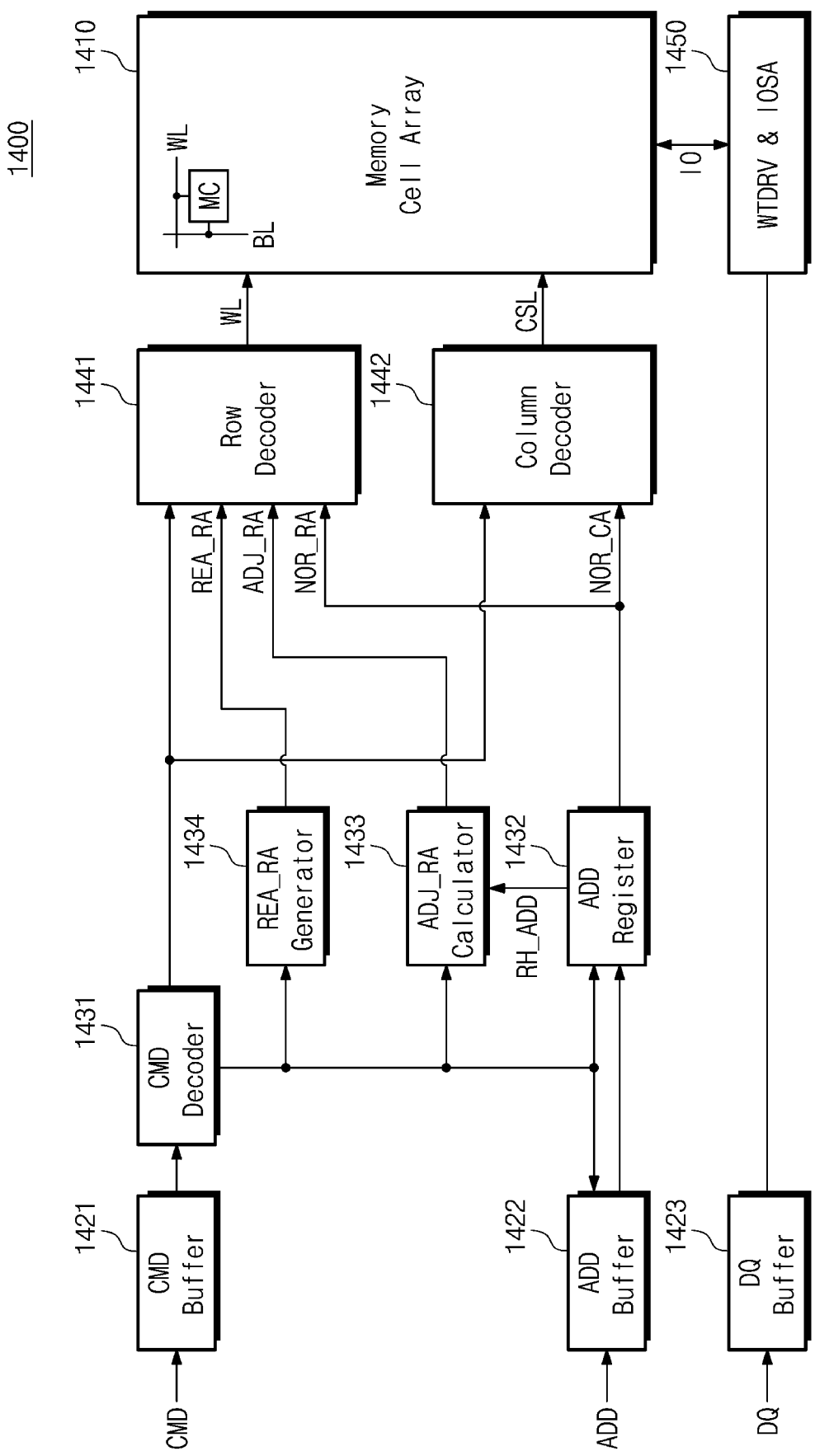
FIG. 5 illustrates an exemplary block diagram of a memory device of FIG. 2.

FIG. 5 illustrates an exemplary block diagram of a memory device of FIG. 2. The memory device 1400 may include a memory cell array 1410, a command buffer 1421, an address buffer 1422, a DQ buffer 1423, a command decoder 1431, an address register 1432, an adjacent row address calculator 1433, a refresh row address generator 1434, a row decoder 1441, a column decoder 1442, and a write driver and input/output sense amplifier 1450.

The memory cell array 1410 may include memory cells MC connected to word lines WL and bit lines BL. In a case where the memory device 1400 is a DRAM device as assumed above, the memory cell MC may be a DRAM cell including a transistor connected to a word line WL and a bit line BL, and a capacitor connected to the transistor. The word lines WL and the bit lines BL may be arranged to be perpendicular to each other.

The command buffer 1421 may receive the command CMD from the register clock driver 1300, and may transmit the command CMD to the command decoder 1431. For example, the command CMD transmitted to the memory device 1400 may include the activate command ACT, the precharge command PRE, a read command RD, a write command WT, the refresh command REF, or the row hammer refresh command RH_REF. The address buffer 1422 may receive the address ADD from the register clock driver 1300, and may transmit the address ADD to the address register 1432. Unlike illustration of FIG. 5, the command buffer 1421 and the address buffer 1422 may be integrated, and the integrated buffer may receive a command/address CA.

The DQ buffer 1423 may operate as a data input/output buffer. The DQ buffer 1423 may receive write data transmitted from the memory controller 1100, and may transmit the received write data to the write driver and input/output sense amplifier 1450. The DQ buffer 1423 may receive read data transmitted from the memory cell array 1410, and may transmit the read data to the memory controller 1100. The number of the buffers 1421, 1422, and 1423 is not limited to the example of FIG. 5, and may be one or more.

The command decoder 1431 may decode the command CMD. The command decoder 1431 may control the address register 1432 and the row decoder 1441 based on the activate command ACT, the precharge command PRE, the refresh command REF, or the row hammer refresh command RH_REF. The command decoder 1431 may control the refresh row address generator 1434 based on the refresh command REF. The command decoder 1431 may control the adjacent row address calculator 1433 based on the row hammer refresh command RH_REF. The command decoder 1431 may control the address register 1432, the column decoder 1442, and the write driver and input/output sense amplifier 1450 based on the write command WT or the read command RD.

In an embodiment, since the address ADD is not transmitted together with the refresh command REF, the command decoder 1431 may deactivate the address buffer 1422 upon receiving the refresh command REF. In contrast, since the row hammer address RH_ADD is transmitted together with the row hammer refresh command RH_REF, the command decoder 1431 may activate the address buffer 1422 upon receiving the row hammer refresh command RH_REF. The command decoder 1431 may activate the address buffer 1422 based on a reference ratio of the row hammer refresh command RH_REF to the refresh commands REF. As described above, the reference ratio is a ratio at which the register clock driver 1300 converts some of a plurality of refresh commands REF to the row hammer refresh commands RH_REF. The command decoder 1431 may count the number of times that the refresh command REF is received, and may activate the address buffer 1422 before the row hammer refresh command RH_REF is received. According to an embodiment, this function of counting the number of times that the refresh command REF is received may not be performed by the command decoder 1431, in which case this counting function is performed by only the command converter 1340 of the register clock driver 1300 as described earlier. That is, the command converter 1340 of the register clock driver 1300 counts the number of times that the refresh command REF is received from the memory controller 1100, and transmits information about the counted number to the command decoder 1431 of the memory device 1400. The same reference ratio or the same reference value may be in advance stored in both the register clock driver 1300 and the memory device 1400.

The address register 1432 may store the address ADD transmitted through the address buffer 1422. The address register 1432 may transmit the address ADD transmitted together with the activate command ACT to the row decoder 1441 as a normal row address NOR_RA under control of the command decoder 1431 decoding the activate command ACT. The address register 1432 may transmit the row hammer address RH_ADD transmitted together with the row hammer refresh command RH_REF to the adjacent row address calculator 1433 under control of the command decoder 1431 decoding the row hammer refresh command RH_REF. The address register 1432 may transmit the address ADD transmitted together with the write command WT or the read command RD to the column decoder 1442 as a normal column address NOR_CA under control of the command decoder 1431 decoding the write command WT or the read command RD.

The adjacent row address calculator 1433 may determine or calculate an adjacent row address ADJ_RA under control of the command decoder 1431 decoding the row hammer refresh command RH_REF. The adjacent row address calculator 1433 may determine the adjacent row address ADJ_RA based on the row hammer address RH_ADD. Here, a word line corresponding to the row hammer address RH_ADD may be adjacent to a word line corresponding to the adjacent row address ADJ_RA. Also, even though the word line corresponding to the row hammer address RH_ADD is repaired to any other word line, the repaired word line corresponding to the row hammer address RH_ADD may be adjacent to the word line or a repair word line corresponding to the adjacent row address ADJ_RA. The adjacent row address calculator 1433 may transmit the adjacent row address ADJ_RA to the row decoder 1441.

The refresh row address generator 1434 may update a refresh row address REF_RA under control of the command decoder 1431 decoding the refresh command REF. The refresh row address generator 1434 may increase or decrease the refresh row address REF_RA whenever the refresh command REF is input. The refresh row address generator 1434 may transmit the refresh row address REF_RA to the row decoder 1441.

The row decoder 1441 may activate at least one of the word lines WL under control of the command decoder 1431 decoding the activate command ACT, the refresh command REF, or the row hammer refresh command RH_REF. The row decoder 1441 may decode the normal row address NOR_RA, the refresh row address REF_RA, or the adjacent row address ADJ_RA, and may activate a word line(s) WL corresponding to the normal row address NOR_RA, the refresh row address REF_RA, or the adjacent row address ADJ_RA. The row decoder 1441 may activate a word line WL corresponding to the normal row address NOR_RA based on the activate command ACT and the normal row address NOR_RA. The row decoder 1441 may activate at least one word line WL corresponding to the refresh row address REF_RA based on the refresh command REF and the refresh row address REF_RA. The row decoder 1441 may activate at least one word line WL corresponding to the adjacent row address ADJ_RA based on the row hammer refresh command RH_REF and the adjacent row address ADJ_RA.

For better understanding, an example is illustrated in FIG. 5 as the normal row address NOR_RA, the refresh row address REF_RA, and the adjacent row address ADJ_RA are separately transmitted to the row decoder 1441, but the normal row address NOR_RA, the refresh row address REF_RA, and the adjacent row address ADJ_RA may be transmitted to the row decoder 1441 through a same address transmission path. The row decoder 1441 may deactivate or precharge the activated word line under control of the command decoder 1431 decoding the precharge command PRE.

The column decoder 1442 may activate at least one of column selection lines CSL under control of the command decoder 1431 decoding the write command WT or the read command RD. The column decoder 1442 may decode the normal column address NOR_CA, and may activate the column selection lines CSL corresponding to the normal column address NOR_CA. For convenience of illustration, an example is illustrated in FIG. 5 as the column selection lines CSL and the word lines WL are parallel to each other, but the column selection lines CSL may be arranged to be perpendicular to the word lines WL. Two or more bit lines BL may be connected to one column selection line CSL.

The write driver and input/output sense amplifier 1450 may receive write data from the DQ buffer 1423, and may write the write data to memory cells selected by the row decoder 1441 and the column decoder 1442 through input/output lines 10. The write driver and input/output sense amplifier 1450 may read data from the selected memory cells through the input/output lines 10, and may transmit the read data to the DQ buffer 1423.

Figure 6:
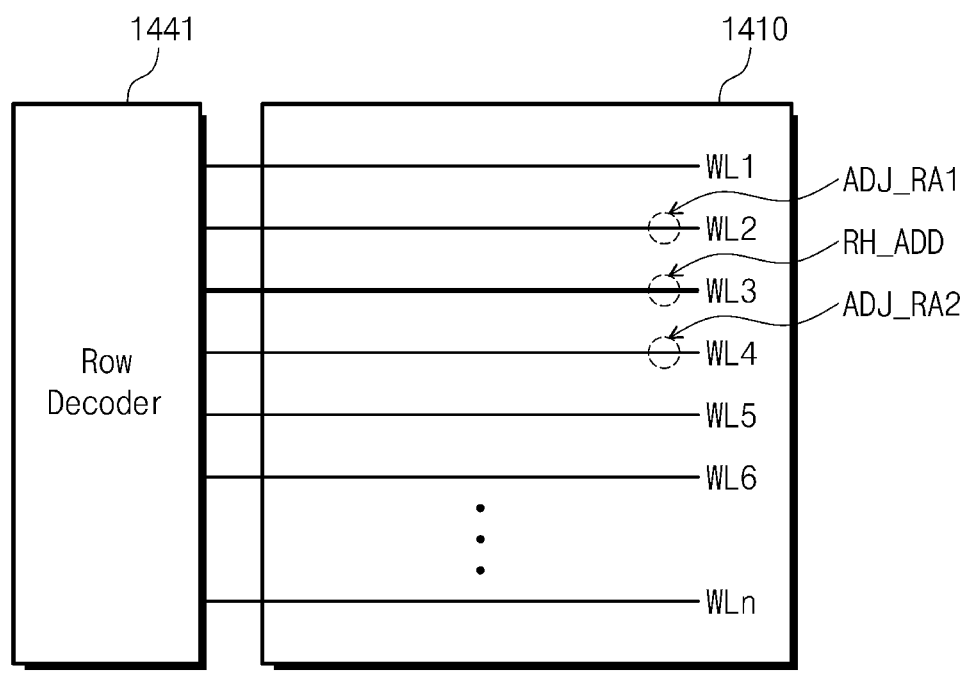
FIG. 6 illustrates a memory cell array and a row decoder of FIG. 5 in detail.

FIG. 6 illustrates a memory cell array and a row decoder of FIG. 5 in detail. FIG. 6 will be described together with reference to FIGS. 2 and 5. For convenience of description, the memory cell array 1410 and the row decoder 1441 of the memory device 1400 are only illustrated in FIG. 6, and the remaining components are omitted.

The row decoder 1441 may activate or deactivate first to n-th word lines WL1 to WLn. Referring to FIG. 6, the third word line WL3 may correspond to the row hammer address RH_ADD described above. As the memory controller 1100 frequently accesses the third word line WL3, disturbance may occur at data stored in memory cells connected to the second word line WL2 or the fourth word line WL4 adjacent to the third word line WL3. The adjacent row address calculator 1433 may determine both an adjacent row address ADJ_RA1 corresponding to the second word line WL2 adjacent to the third word line WL3 and an adjacent row address ADJ_RA2 corresponding to the fourth word line WL4 adjacent to the third word line WL3. The adjacent row address ADJ_RA indicates both the adjacent row addresses ADJ_RA1 and ADJ_RA2. The adjacent row address calculator 1433 may transmit the adjacent row addresses ADJ_RA1 and ADJ_RA2 to the row decoder 1441.

The row decoder 1441 may activate and deactivate the second word line WL2 based on the adjacent row address ADJ_RA1. Next, the row decoder 1441 may activate and deactivate the fourth word line WL4 based on the adjacent row address ADJ_RA2. The row decoder 1441 may first activate the fourth word line WL4 before the second word line WL2. When a word line is activated, data of a memory cell connected to the word line may be amplified by a bit line sense amplifier (not illustrated) connected to the memory cell, and thus, the memory cell may be refreshed. For example, the second word line WL2 and the fourth word line WL4 may not be activated at the same time.

To sum up, when the memory controller 1100 frequently accesses the third word line WL3, the register clock driver 1300 may detect the row hammer address RH_ADD corresponding to the third word line WL3, and may transmit the row hammer address RH_ADD and the row hammer refresh command RH_REF to the memory device 1400. The memory device 1400 may refresh memory cells connected to the second and fourth word lines WL2 and WL4 by calculating the adjacent row addresses ADJ_RA1 and ADJ_RA2 based on the row hammer address RH_ADD and the row hammer refresh command RH_REF and by activating and deactivating the second and fourth word lines WL2 and WL4 corresponding to the adjacent row addresses ADJ_RA1 and ADJ_RA2. Accordingly, the row hammering which may occur as the third word line WL3 is frequently accessed may be prevented.

Figure 7:
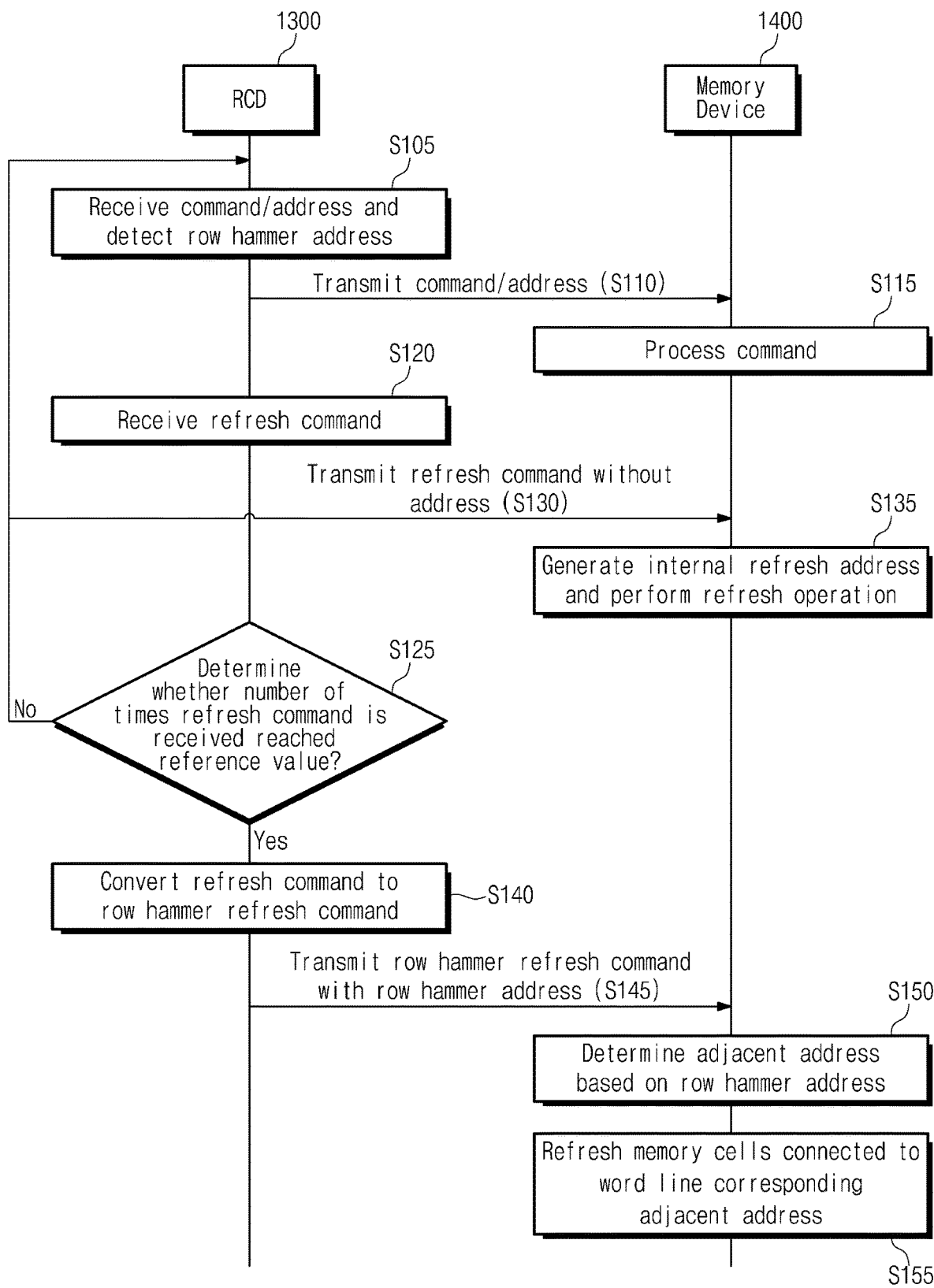
FIG. 7 illustrates an exemplary flowchart of operations of a register clock driver and a memory device of the memory module of FIG. 2.

FIG. 7 illustrates an exemplary flowchart of operations of a register clock driver and a memory device of the memory module of FIG. 2. FIG. 7 will be described with reference to FIG. 2.

In operation S105, the register clock driver 1300 may receive the command CMD and the address ADD from the memory controller 1100. The register clock driver 1300 may latch the addresses ADD received together with the activate commands ACT, and may detect the row hammer address RH_ADD, which is frequently accessed, from among the addresses ADD. The addresses ADD received together with the activate commands ACT may correspond to word lines of the memory cell array 1410. For example, when the command CMD transmitted from the memory controller 1100 is the activate command ACT in operation S105, the register clock driver 1300 may count or increase an access value corresponding to the address ADD received together with the activate command ACT.

In operation S110, the register clock driver 1300 may transmit the command CMD and the address ADD received in operation S105 to the memory device 1400. In operation S115, the memory device 1400 may process the command CMD transmitted in operation S110. For example, the memory device 1400 may perform data input/output on the memory cell array 1410 based on the address ADD.

In operation S120, the register clock driver 1300 may receive the refresh command REF from the memory controller 1100. The register clock driver 1300 may count the number of times that the refresh command REF is received. The memory controller 1100 may not generate the address ADD indicating a location of memory cells to be refreshed upon generating the refresh command REF.

In operation S125, the register clock driver 1300 may determine whether the number of times that the refresh command REF is received reaches a reference value. As described above, the reference value may be a value which is determined according to a reference ratio of the row hammer refresh command RH_REF to the refresh commands REF. When the number of times that the refresh command REF is received does not reach the reference value (No), the register clock driver 1300 may perform operation S130, and may return to operation S105.

In operation S130, the register clock driver 1300 may transmit the refresh command REF received in operation S120 to the memory device 1400 without an address. The command buffer 1421 of the memory device 1400 receiving the refresh command REF may be in an activated state, and the address buffer 1422 of the memory device 1400 may be in a deactivated state.

In operation S135, the refresh row address generator 1434 of the memory device 1400 may generate the refresh row address REF_RA based on the refresh command REF. The memory device 1400 may refresh memory cells connected to a word line corresponding to the refresh row address REF_RA by activating and deactivating the word line corresponding to the refresh row address REF_RA. Operations S120, S125, S130, and S135 may be repeatedly performed. The memory controller 1100 may repeatedly generate the plurality of refresh commands REF for refreshing all memory cells of the memory device 1400. The refresh row address generator 1434 of the memory device 1400 may update the refresh row address REF_RA whenever the refresh command REF is received, and the memory device 1400 may refresh all memory cells.

When the number of times that the refresh command REF is received reaches the reference value in operation S125 (Yes), the register clock driver 1300 may perform operation S140. In operation S140, the register clock driver 1300 may convert the refresh command REF received in operation S120 to the row hammer refresh command RH_REF.

In operation S145, the register clock driver 1300 may transmit the row hammer refresh command RH_REF to the memory device 1400. Also, the register clock driver 1300 may transmit the row hammer address RH_ADD detected by repeatedly performing operation S105 to the memory device 1400 together with the row hammer refresh command RH_REF.

In operation S150, the adjacent row address calculator 1433 of the memory device 1400 may generate the adjacent row address ADJ_RA based on the row hammer address RH_ADD. As illustrated in FIG. 6, the number of adjacent row addresses ADJ_RA may be one or more.

In operation S155, the memory device 1400 may refresh memory cells connected to a word line corresponding to the adjacent row address ADJ_RA.

To sum up, the memory device 1400 may refresh all memory cells based on the refresh commands REF generated by the memory controller 1100. According to an embodiment, the register clock driver 1300 may convert some of the refresh commands REF to the row hammer refresh commands RH_REF, and may transmit the row hammer refresh command RH_REF and the row hammer address RH_ADD to the memory devices 1400. The memory device 1400 may refresh memory cells, of which the refresh characteristic may be degraded due to the row hammering, based on the row hammer refresh commands RH_REF and the row hammer address RH_ADD. Since the register clock driver 1300 detects the row hammer address RH_ADD and each of the memory devices 1400 does not detect the row hammer address RH_ADD, the area of the respective memory devices 1400 may be reduced.

Figure 8:
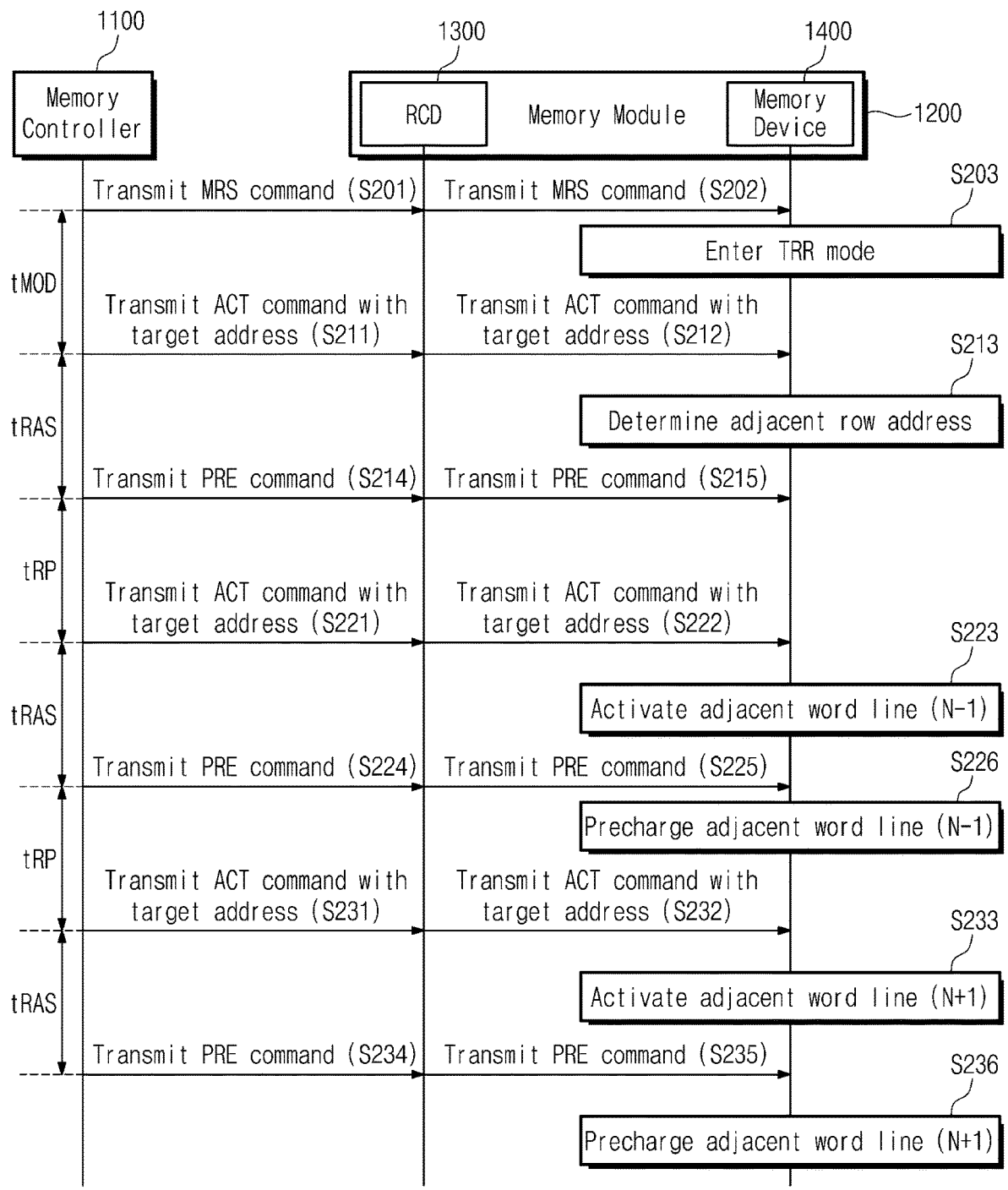
FIG. 8 illustrates an exemplary flowchart of operations of a memory controller, and a register clock driver and a memory device of a memory module.

FIG. 8 illustrates an exemplary flowchart of operations of a memory controller, and a register clock driver and a memory device of a memory module. FIGS. 1 to 7 describe the operations where the register clock driver 1300 and the memory devices 1400 in the memory module 1200 refresh memory cells, of which the refresh characteristic may be degraded due to row hammering, by using the refresh commands REF which the memory controller 1100 generates. In FIGS. 1 to 7, the memory controller 1100 may only generate a plurality of refresh commands REF, and may not transmit the memory module 1200 with address information about memory cells, of which the refresh characteristic may be degraded due to the row hammering. In contrast, the memory controller 1100 of FIG. 8 may directly refresh the memory cells, of which the refresh characteristic may be degraded due to the row hammering, through a target row refresh (TRR) mode.

In operation S201, the memory controller 1100 may transmit a mode register set (MRS) command for entering the TRR mode to the register clock driver 1300. In operation S202, the register clock driver 1300 may transmit the MRS command to the memory device 1400. In operation S203, the memory device 1400 may enter the TRR mode.

When a time of tMOD elapses after the MRS command is transmitted, in operation S211, the memory controller 1100 may transmit an activate command ACT and a target address "N" to the register clock driver 1300. Here, the target address "N" may correspond to the row hammer address RH_ADD described with reference to FIGS. 1 to 7, but may be generated by the memory controller 1100. "N" may indicate a value of a target address and may be a natural number. In operation S212, the register clock driver 1300 may transmit the activate command ACT and the target address "N" to the memory device 1400. In operation S213, the adjacent row address calculator 1433 of the memory device 1400 may determine and latch adjacent row addresses (N−1) and (N+1) of word lines, which are adjacent to a target word line corresponding to the target address "N", based on the target address "N".

When a time of tRAS elapses after the activate command ACT is transmitted, in operation S214, the memory controller 1100 may transmit a precharge command PRE to the register clock driver 1300. In operation S215, the register clock driver 1300 may transmit the precharge command PRE to the memory device 1400.

When a time of tRP elapses after the precharge command PRE is transmitted, in operation S221, the memory controller 1100 may transmit an activate command ACT and the target address "N" to the register clock driver 1300. In operation S222, the register clock driver 1300 may transmit the activate command ACT and the target address "N" to the memory device 1400. In operation S223, the memory device 1400 may activate a word line adjacent to the adjacent row address (N−1). When the time of tRAS elapses after the activate command ACT is transmitted, in operation S224, the memory controller 1100 may transmit a precharge command PRE to the register clock driver 1300. In operation S225, the register clock driver 1300 may transmit the precharge command PRE to the memory device 1400. In operation S226, the memory device 1400 may precharge or deactivate the activated word line.

Operation S231 to operation S236 are performed to be similar to operation S221 to operation S226. However, a word line which is activated in operation S223 and is precharged in operation S226 is different from a word line which is activated in operation S233 and is precharged in operation S236. For example, the word line associated with operation S223 and operation S226 may correspond to the adjacent row address (N−1), and the word line associated with operation S233 and operation S236 may correspond to the adjacent row address (N+1). Also, unlike illustration of FIG. 8, operation S231 to operation S236 may be performed prior to operation S221 to operation S226.

Figure 9:
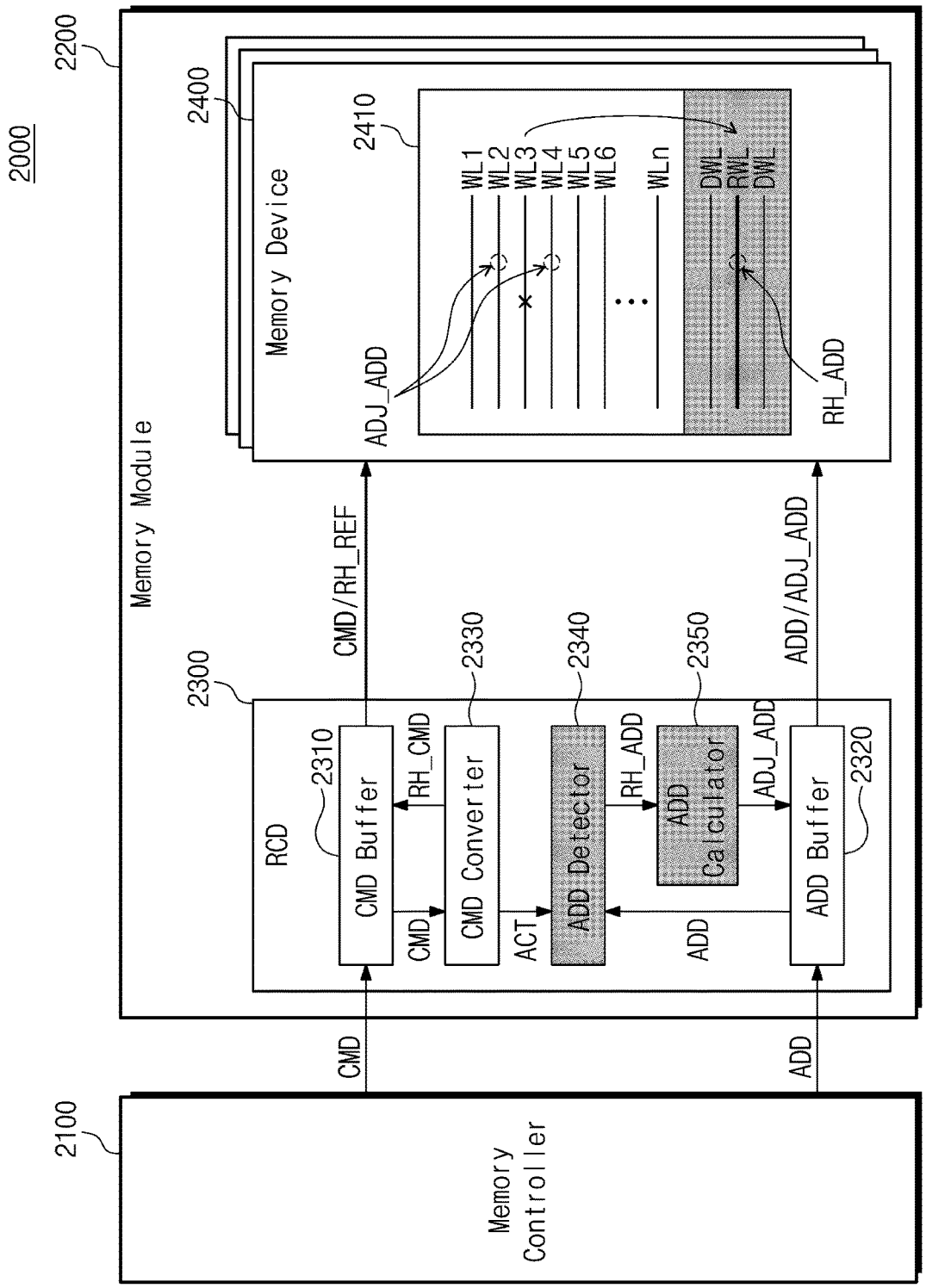
FIG. 9 illustrates is a block diagram of an electronic device according to another embodiment.

FIG. 9 illustrates is a block diagram of an electronic device according to an embodiment. An electronic device 2000 may include a memory controller 2100 and a memory module 2200. An operation of the memory controller 2100 may be similar to the operation of the memory controller 1100 described with reference to FIGS. 1 to 8. The memory module 2200 may include a register clock driver 2300 and a memory device 2400.

The register clock driver 2300 may include a command buffer 2310, an address buffer 2320, a command converter 2330, an address detector 2340, and an address calculator 2350. The command buffer 2310, the address buffer 2320, the command converter 2330, and the address detector 2340 are described with reference to FIG. 2. An operation of the address calculator 2350 may be similar to the operation of the adjacent row address calculator 1433 of FIG. 5. The address calculator 2350 may perform an addition operation or a subtraction operation on the row hammer address RH_ADD, and may determine adjacent addresses ADJ_ADD corresponding to the above-described adjacent row address ADJ_RA. The address calculator 2350 may transmit the adjacent addresses ADJ_ADD to the address buffer 2320. The address buffer 2320 may transmit the adjacent addresses ADJ_ADD to the memory devices 2400. The register clock driver 2300 may transmit the adjacent addresses ADJ_ADD to the memory devices 2400 together with the row hammer refresh command RH_REF.

Each of the memory devices 2400 may include a memory cell array 2410. Of course, the memory device 2400 may further include any other components described with reference to FIG. 5. The memory cell array 2410 may be divided into an area in which normal word lines WL1 to WLn are arranged and an area in which redundancy word lines RWL are arranged. Some of the redundancy word lines RWL may correspond to dummy word lines DWL and may not be used. The memory controller 2100 may fail to access the redundancy word line(s) RWL which is used as the dummy word line DWL. For example, the dummy word lines DWL may be interposed between the redundancy word lines RWL. Memory cells connected to the redundancy word lines RWL may be accessed by the memory controller 2100 depending on whether the redundancy word lines RWL are used to repair, but memory cells connected to the dummy word lines DWL may not be accessed by the memory controller 2100 regardless of whether a repair operation is performed.

As illustrated in FIG. 9, a third word line WL3 corresponding to a row hammer address RH_ADD may be repaired to the redundancy word line RWL illustrated in FIG. 9. After the third word line WL3 is repaired, not the third word line WL3 but the redundancy word line RWL may correspond to the row hammer address RH_ADD. For example, the memory device 2400 may include a register (not illustrated) storing a fail row address of the memory cell array 2410 after repairing. When the row hammer address RH_ADD matches the fail row address, a row decoder (corresponding to 1441) may activate the redundancy word line RWL instead of the third word line WL3, based on the row hammer address RH_ADD.

The memory device 2400 may activate the second and fourth word lines WL2 and WL4 corresponding to the adjacent addresses ADJ_ADD in response to the row hammer refresh command RH_REF. Even though redundancy word lines adjacent to the redundancy word line RWL are not activated by the above-described refresh operation, as described above, redundancy word lines adjacent to the redundancy word line RWL may be dummy word lines. Since a dummy word line is not accessed by the memory controller 2100, influence of the row hammering may be ignored.

To sum up, a redundancy word line adjacent to the redundancy word line RWL of the memory device 2400 may be a dummy word line DWL, and may not be used. Accordingly, the register clock driver 2300 may include the address calculator 2350 which performs an addition operation and a subtraction operation on the row hammer address RH_ADD. Since some of the redundancy word lines RWL of the memory device 2400 are not used, the adjacent row address calculator 1433 of the memory device 1400 may not be included in the memory device 2400, and may be included in the register clock driver 2300 together with the address detector 2340. The memory device 2400 may not include both the address detector 1330 and the adjacent row address calculator 1433, thus making the area of the memory device 2400 smaller at least by the area of the address detector 1330.

Figure 10:
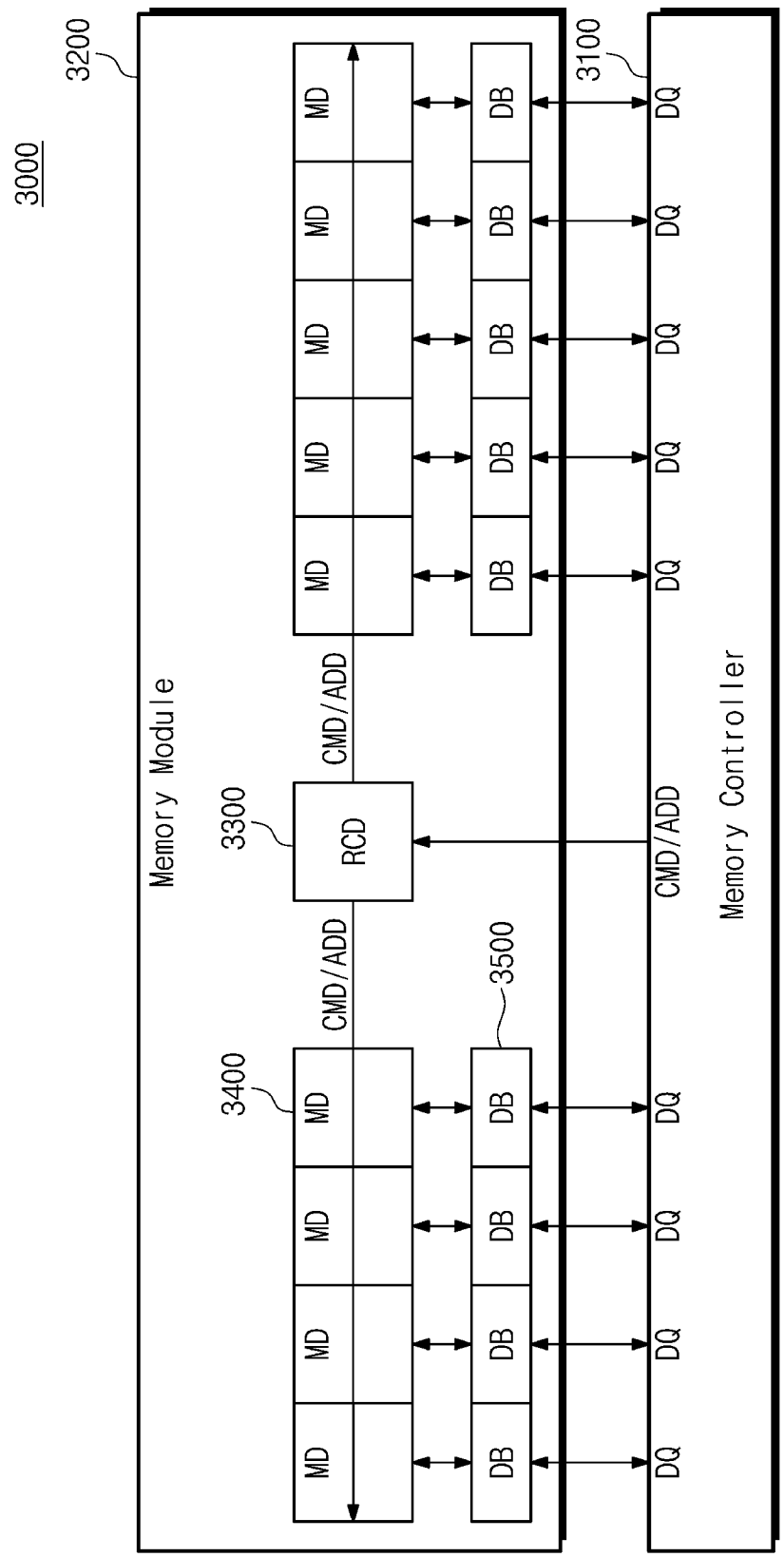
FIG. 10 illustrates an electronic device of FIG. 2 or an electronic device of FIG. 9.

FIG. 10 illustrates an electronic device of FIG. 2 or an electronic device of FIG. 9. An electronic device 3000 may include a memory controller 3100 and a memory module 3200. The memory module 3200 may include a register clock driver 3300, memory devices 3400, and data buffers 3500. Here, the electronic device 3000 may be any one of the electronic devices 1000 and 2000 described above. The memory controller 3100 may be any one of the memory controllers 1100 and 2100 described above. The memory module 3200 may be any one of the memory modules 1200 and 2200 described above. The register clock driver 3300 may be any one of the register clock drivers 1300 and 2300 described above. The memory device 3400 may be any one of the memory devices 1400 and 2400 described above. The number of the memory devices 3400 is not limited to the example illustrated in FIG. 10.

The register clock driver 3300 may receive the command CMD and the address ADD from the memory controller 3100. The register clock driver 3300 may transmit the command CMD and the address ADD to the memory devices 3400. For example, all the memory devices 3400 of the memory module 3200 may share a path for receiving the command CMD and the address ADD. For another example, the first memory devices 3400 (e.g., memory devices positioned on the left side with respect to the register clock driver 3300) of the memory module 3200 may share a first path for receiving the command CMD and the address ADD.

The second memory devices 3400 (e.g., memory devices positioned on the right side with respect to the register clock driver 3300) of the memory module 3200 may share a second path for receiving the command CMD and the address ADD. The memory module 3200 may further include third memory devices 3400 which share a third path for receiving the command CMD and the address ADD.

Each of the memory devices 3400 may communicate with the memory controller 3100 through the data buffer 3500. Each of the memory devices 3400 may exchange data with the memory controller 3100 through the data buffer 3500. The memory devices 3400 may be accessed in parallel by the memory controller 3100.

In an embodiment, the register clock driver 3300 may be implemented by using a system on chip (SoC), an application specific integrated circuit (ASIC), a field programmable gate array (FPGA), etc. Also, each of the register clock driver 3300 and the memory devices 3400 may be implemented by using packages such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), metric quad flat pack (MQFP), thin quad flat pack (TQFP), small outline integrated circuit (SOIC), shrink small outline package (SSOP), thin small outline package (TSOP), system in package (SIP), multi-chip package (MCP), wafer-level fabricated package (WFP), and wafer-level processed stack package (WSP), etc.

A register clock driver of a memory module according to an embodiment may include an address detector which detects a row hammer address frequently accessed by a memory controller. Since the register clock driver includes an address detector, each of memory devices of the memory module may not include the address detector. Accordingly, the area of the respective memory devices may be reduced.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A memory module comprising:
a plurality of memory devices each comprising a memory cell array; and
a register clock driver connected to the plurality of memory devices,
wherein the register clock driver is configured to:
  latch a first address among addresses corresponding to word lines of the memory cell array received from a memory controller;
  convert a first command comprising a first plurality of control signals for refreshing the memory cell array to a second command comprising a second plurality of control signals different from the first plurality of control signals, the first command being received from the memory controller; and
  transmit the first address and the second command to the plurality of memory devices without sending the first command to the plurality of memory devices;
  receive a third command comprising the first plurality of control signals from the memory controller after receiving the first command; and
  transmit the third command to the plurality of memory devices.

2. The memory module of claim 1, wherein each of the plurality of memory devices is configured to:
  calculate a second address corresponding to a second word line adjacent to a first word line among the word lines, based on the second command and the first address corresponding to the first word line; and
  activate the second word line based on the second command and the second address.

3. The memory module of claim 2, wherein each of the plurality of memory devices is configured to activate at least one word line of the word lines based on the third command.

4. The memory module of claim 3, wherein each of the plurality of memory devices comprises an address buffer receiving the addresses,
  wherein, when each of the plurality of memory devices receives the second command, the address buffer is activated, and
  wherein, when each of the plurality of memory devices receives the third command, the address buffer is deactivated.

5. The memory module of claim 2, wherein the register clock driver is further configured to:
  receive a mode register set command, an activate command for accessing a third word line corresponding to a third address among the word lines, and the third address from the memory controller; and
  transmit the activate command and the third address to the plurality of memory devices, and
  wherein each of the plurality of memory devices is configured to:
  calculate a fourth address corresponding to a fourth word line adjacent to the third word line, based on the activate command and the third address; and
  activate the fourth word line based on the activate command and the fourth address.

6. The memory module of claim 1, wherein the memory cell array of each of the plurality of memory devices comprises:
  first redundancy memory cells connected to first redundancy word lines; and
  second redundancy memory cells connected to second redundancy word lines interposed between the first redundancy word lines and not accessed by the memory controller.

7. The memory module of claim 6, wherein the register clock driver is further configured to:
  generate a second address based on the second command and the first address; and
  transmit the second address to the plurality of memory devices, and
  wherein each of the plurality of memory devices is configured to activate a word line corresponding to the second address among the word lines based on the second command and the second address.

8. A memory module comprising:
a plurality of memory devices; and
a register clock driver configured to receive a plurality of first commands for refreshing a memory cell array of each of the plurality of memory devices from a memory controller, convert one first command among the plurality of first commands to a second command, and transmit remaining first commands, which are not converted, of the plurality of first commands and the second command to the plurality of memory devices,
  wherein the register clock driver is further configured to receive a first row address corresponding to a first word line of the memory cell array from the memory controller at least once or more, latch the first row address, and transmit the first row address to the plurality of memory devices together with the second command, wherein each of the plurality of the first commands comprises a plurality of first control signals, and wherein the second command comprises a second plurality of control signals different from the first plurality of control signals.

9. The memory module of claim 8, wherein the register clock driver is configured to convert the one first command of the plurality of first commands to the second command, based on a reference ratio.

10. The memory module of claim 9, wherein each of the plurality of memory devices comprises an address buffer configured to receive the first row address, and wherein each of the plurality of memory devices is configured to activate the address buffer based on the reference ratio before receiving the second command from the register clock driver.

11. The memory module of claim 8, wherein, before the one first command of the plurality of first commands is converted to the second command by the register clock driver, the number of times that the first word line is activated by the memory controller is greater than the number of times that a second word line of the memory cell array is activated by the memory controller.

12. The memory module of claim 8, wherein the plurality of memory devices share paths for receiving the plurality of first commands, the second command, and the first row address from the register clock driver.

13. The memory module of claim 8, wherein each of the plurality of memory devices is configured to:

generate a second row address corresponding to a second word line of the memory cell array, based on the second command and the first row address received from the register clock driver; and activate the second word line based on the second command and the second row address.

14. The memory module of claim 13, wherein each of the plurality of memory devices comprises a register storing a fail row address for repairing of the memory cell array, wherein, when the first row address is matched with the fail row address, the first word line and the second word line are not adjacent to each other, and wherein a third word line of the memory cell array adjacent to the first word line is not accessed by the memory controller.

15. A memory module comprising:

a plurality of memory devices each comprising a memory cell array; and a register clock driver configured to receive a plurality of activate commands from a memory controller and transmit the plurality of activate commands to the plurality of memory devices, wherein the register clock driver is configured to:

count the number of times that a first address corresponding to a first word line, which is activated by first activate commands among the plurality of activate commands, of the memory cell array is repeatedly received;

latch the first address based on a result of the counting;

convert one first command of a plurality of first commands for refreshing the memory cell array to a second command; and transmit the first address and the second command to the plurality of memory devices without sending the one first command of the plurality of first commands to the plurality of memory devices, wherein each of the plurality of first commands comprises a plurality of first control signals, and wherein the second command comprises a second plurality of control signals different from the first plurality of control signals.

16. The memory module of claim 15, wherein the number of times that the register clock driver receives the first address is greater than the number of times that the register clock driver repeatedly receives a second address corresponding to a second word line, which is activated by second activate commands among the plurality of activate commands, of the memory cell array.

17. The memory module of claim 15, wherein each of the plurality of memory devices is configured to:

update an refresh row address for refreshing the memory cell array, when remaining first commands, which are not converted, of the plurality of first commands are received; and activate a second word line of the memory cell array corresponding to the refresh row address, based on the remaining first commands and the refresh row address.

18. The memory module of claim 17, wherein each of the plurality of memory devices is configured to:

generate a second address of the memory cell array based on the second command and the first address; and activate a third word line of the memory cell array corresponding to the second address, based on the second command and the second address.

19. The memory module of claim 15, wherein each of the plurality of memory devices is configured to receive the plurality of activate commands from the memory controller through the register clock driver, and wherein the plurality of memory devices are accessed in parallel by the memory controller.

20. The memory module of claim 1, wherein the register clock driver is configured to receive a plurality of commands including at least one of an activate command, a precharge command, and a refresh command, wherein the first command and the third command comprise the refresh command, and wherein the second command comprises a hammer refresh command.

* * * * *